United States Patent
Dudeck et al.

(10) Patent No.: US 7,042,779 B2
(45) Date of Patent: May 9, 2006

(54) METHOD AND APPARATUS FOR REDUCING LEAKAGE CURRENT IN A READ ONLY MEMORY DEVICE USING PRE-CHARGED SUB-ARRAYS

(75) Inventors: Dennis E. Dudeck, Hazelton, PA (US); Donald Albert Evans, Lancaster, OH (US); Richard Joseph McPartland, Nazareth, PA (US); Hai Quang Pham, Hatfield, PA (US)

(73) Assignee: Agere Systems Inc., Allentown, PA (US)

( * ) Notice: Subject to any disclaimer, the term of this patent is extended or adjusted under 35 U.S.C. 154(b) by 137 days.

(21) Appl. No.: 10/764,152

(22) Filed: Jan. 23, 2004

(65) Prior Publication Data

US 2005/0162952 A1    Jul. 28, 2005

(51) Int. Cl.
G11C 7/00    (2006.01)
(52) U.S. Cl. .................. 365/203; 365/94; 365/104
(58) Field of Classification Search .............. None
See application file for complete search history.

(56) References Cited

U.S. PATENT DOCUMENTS

| | | | | |
|---|---|---|---|---|
| 4,318,014 A | * | 3/1982 | McAlister et al. ......... 326/106 |
| 4,520,465 A | * | 5/1985 | Sood ........................ 365/203 |
| 4,774,691 A | * | 9/1988 | Hidaka ...................... 365/203 |
| 4,920,516 A | * | 4/1990 | Tsuchimoto ............... 365/203 |
| 4,972,373 A | * | 11/1990 | Kim et al. ................. 365/203 |
| 5,459,693 A | * | 10/1995 | Komarek et al. .......... 365/207 |
| 5,493,535 A | * | 2/1996 | Cho ..................... 365/230.04 |
| 6,034,884 A | * | 3/2000 | Jung ........................ 365/145 |
| 6,240,049 B1 | * | 5/2001 | Inoue ....................... 365/233 |
| 6,430,099 B1 | * | 8/2002 | Rogenmoser et al. ..... 365/203 |
| 6,459,615 B1 | | 10/2002 | McPartland et al. ...... 365/185.1 |
| 6,512,700 B1 | | 1/2003 | McPartland et al. ... 365/185.28 |
| 6,621,758 B1 | * | 9/2003 | Cheung et al. ....... 365/230.03 |

* cited by examiner

*Primary Examiner*—Tan T. Nguyen (57) ABSTRACT

A method and apparatus are provided for reducing leakage current in a read only memory device. Leakage current is reduced by precharging only a portion of the columns in a read only memory array during a given read cycle. The portion of the columns that are precharged is limited to a subset of columns that includes those columns that will be read during a given read cycle. A read column address is decoded to precharge only the portion of the columns of transistors that will be read during the given read cycle. The columns of transistors can be grouped into a plurality of sub-arrays and only those sub-arrays having columns that will be read during a given read cycle are precharged during the read cycle.

21 Claims, 6 Drawing Sheets

METHOD AND APPARATUS FOR REDUCING LEAKAGE CURRENT IN A READ ONLY MEMORY DEVICE USING PRE-CHARGED SUB-ARRAYS

CROSS-REFERENCE TO RELATED APPLICATIONS

The present application is related to U.S. patent application Ser. No. 10/764,150, entitled "Method and Apparatus for Reducing Leakage Current in a Read Only Memory Device Using Shortened Precharge Phase," and U.S. patent application Ser. No. 10/764,000, entitled "Method and Apparatus for Reducing Leakage Current in a Read Only Memory Device Using Transistor Bias," each filed contemporaneously herewith and incorporated by reference herein.

FIELD OF THE INVENTION

The present invention relates generally to electronic memory devices, and more particularly to the reduction of leakage current in electronic memory devices comprised of arrays of transistors.

BACKGROUND OF THE INVENTION

Data storage devices, such as read only memories ("ROMs"), typically store data in arrays of memory cells. Generally, a memory cell consists of a single transistor for each bit to be stored. The memory array is typically permanently programmed during the fabrication process. Thus, ROM memory devices are generally used to store data or code that will not be altered after the ROM memory device is manufactured. Non-volatile ROM memory devices, such as electrically erasable programmable ROMs (EEPROMs), are capable of maintaining stored information even in the absence of power.

ROM memory devices are often fabricated, for example, using Complementary Metal Oxide Semiconductor (CMOS) semiconductor fabrication technologies. As the size of ROM memory devices decrease, with improvements in integrated circuit fabrication technologies, the more narrow trace widths and shorter channel lengths of the ROM memory cell transistors can cause high leakage currents, referred to as transistor sub-threshold leakage current. In previous CMOS technologies, where trace widths were on the order 0.16 micrometers ($\mu$m) or more, transistor sub-threshold leakage current was much lower, even for relatively short channel length and narrow width devices. ROM memories fabricated using these prior CMOS technologies typically did not suffer from significant leakage problems.

With more advanced CMOS technologies having trace widths of 0.16 $\mu$m or less, however, the transistor sub-threshold leakage current becomes a significant problem. A number of techniques have been proposed or suggested for reducing transistor sub-threshold leakage current in CMOS transistors, including the use of relatively long channel length or relatively wider channel width cell transistors (or both). Such techniques, however, cause an undesirable increase in the physical size of the memory device, reduce the maximum frequency of operation and increase the active and standby currents. A need therefore exists for improved techniques for reducing leakage current in ROM devices.

SUMMARY OF THE INVENTION

Generally, a method and apparatus are provided for reducing leakage current in a read only memory device. The present invention reduces leakage current by precharging only a portion of the columns in a read only memory array during a given read cycle. In particular, the portion of the columns that are precharged is limited to a subset of columns that includes those columns that will be read during a given read cycle. The present invention recognizes that in a read cycle, where typically only a cell along the selected column will be read, only the corresponding column needs to be precharged.

In one implementation, a read column address is decoded to precharge only the portion of the columns of transistors that will be read during the given read cycle. In another variation, the columns of transistors are grouped into a plurality of sub-arrays and only those sub-arrays having columns that will be read during a given read cycle are precharged during the read cycle. Among other benefits, the reading operation of the present invention provides for faster operation and lower active current due to the smaller capacitances associated with smaller cell transistors. In addition, the power supply voltage drop is reduced due to high leakage current, thereby improving performance and reducing the need for wider power supply buses.

A more complete understanding of the present invention, as well as further features and advantages of the present invention, will be obtained by reference to the following detailed description and drawings.

DETAILED DESCRIPTION

Figure 1:
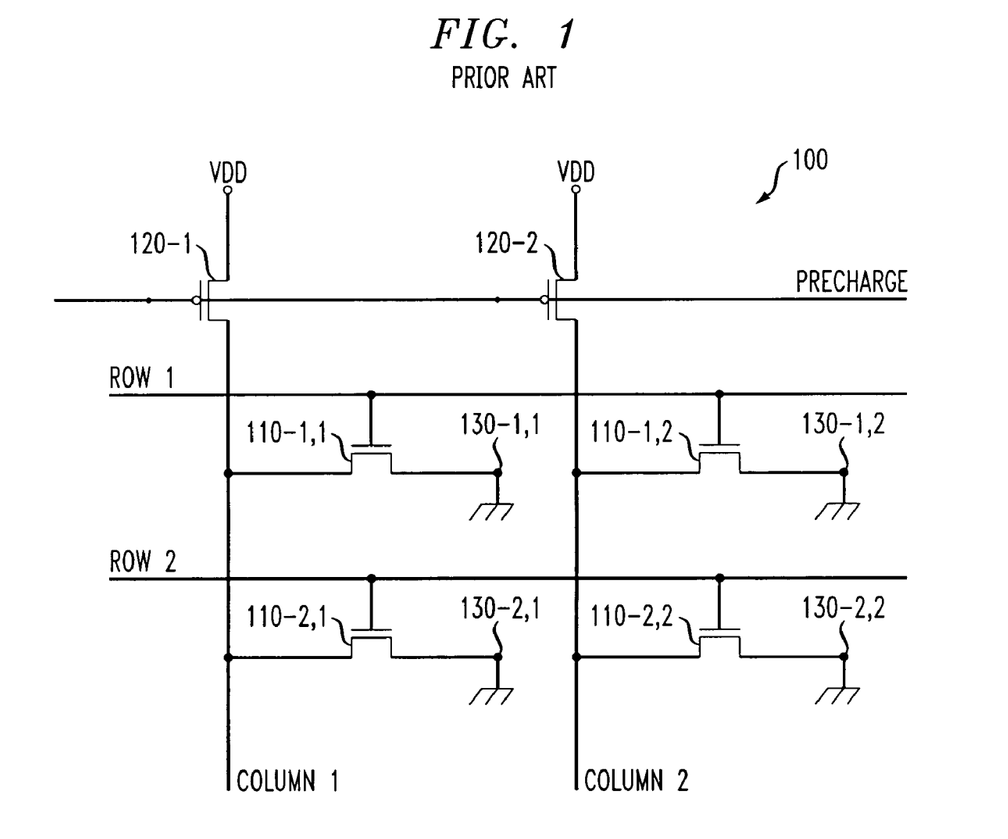
FIG. 1 illustrates a conventional array of n-channel memory cells for a read only memory device.

FIG. 1 illustrates a conventional ROM memory cell array with column precharge transistors. The memory cell transistors are n-channel transistors. The precharge transistors are p-channel devices. This type of ROM array is referred to as an "n-channel" array. There is also an analogous "p-channel" ROM memory array (not shown) where the cell transistors are p-channel transistors and the precharge transistors are n-channel transistors. For clarity, unless otherwise specified, all references and specified voltages herewithin apply to n-channel ROM memory arrays.

FIG. 1 illustrates a conventional n-channel two by two ROM array 100 of memory cells 110-1,1 through 110-i,j. The memory cells 110-1,1 through 110-i,j are generally comprised of n-channel transistors generally arranged in a grid pattern having a plurality (or series) of rows and columns. As shown in FIG. 1, the exemplary ROM array 100 includes a plurality, i, of rows (i=2), and a plurality, j, of columns (j=2). Each memory cell 110 has an associated programmable contact window 130-i,j that may optionally be programmed during the fabrication process.

Each column is supplied with power (VPC) at a first predetermined voltage level, often referred to as the "pre-charged voltage level," and each row is supplied with power at a second predetermined voltage level. Values for these first and second predetermined voltage levels typically depend upon the selected ROM implementation. For example, when the transistors 110 of the array 100 are n-channel (n-channel array), the column is typically pre-charged to a first predetermined voltage level substantially equal to the power supply voltage ("$V_{DD}$") or another selected pre-charged positive voltage level, while the second predetermined voltage level is typically ground or zero volts ("$V_{SS}$"). When the transistors 110 of the array 100 are p-channel (p-channel array), the column is typically pre-charged to the first predetermined voltage level substantially equal to a ground potential, zero volts ("$V_{SS}$") or another selected pre-charged voltage level below $V_{DD}$, while the second predetermined voltage level is substantially equal to the power supply voltage $V_{DD}$.

A gate of each transistor 110 of a ROM array 100 is connected to a particular row of the series of rows. A source of each transistor is generally connected to the source voltage bus, and a drain of each transistor is or is not connected to a particular column of the series of columns, depending upon how the cell 110 is to be programmed. The ROM array 100 is programmed during fabrication by the presence or absence of such a drain-to-column connection (a drain-to-column "contact window"). As indicated above, each column of the series of columns is typically pre-charged to a first predetermined voltage potential referred to as the "pre-charged voltage level", VPC. This voltage level is different than that of the source voltage bus, Vsvb. VPC is typically $V_{DD}$ for an n-channel array and $V_{SS}$ for a p-channel array. The voltage of the source voltage bus, Vsvb, for an n-channel array is typically 0 volts ("$V_{SS}$"). The voltage of the source voltage bus, Vsvb, for a p-channel array is typically the power supply voltage, $V_{DD}$. The column residing at the pre-charge voltage represents a first logical state such referred to as a "1" data state or a first data state, and is subject to operation of its associated transistor(s).

The memory cells of a ROM array are typically preprogrammed via the presence or absence of a contact window between their transistor drains and their corresponding columns, while all sources are coupled to the source voltage bus. All columns are pre-charged to the pre-charged voltage level VPC using p-channel precharge transistors 120. When a "1" data state is desired for a particular bit stored on a particular transistor, no contact is made between that transistor drain and its corresponding column (i.e., absence of the contact window). As a consequence, the column continues to maintain its pre-charged voltage when a row connected to that transistor gate (i.e., a corresponding row) is activated, given the absence of a drain contact to the column. In contrast, when a second logical state referred to as a "0" data state or a second data state is desired for the particular bit stored on a particular transistor, given that its drain is coupled to its corresponding column via the contact window, when the row connected to that transistor gate (i.e., a corresponding row) is activated and the transistor conducts, that column voltage is moved or pulled to the potential of the source voltage bus. That column, therefore, does not maintain its pre-charged voltage level associated with the logical high or first data state, but now represents a logical low or second data state.

To obtain information from a ROM, by a "Read" operation, a row is typically activated. All transistors along that row are activated via their respective gates. Along the activated row, all of the transistors that have been programmed to a "0" data state move their respective columns towards Vsvb potential. All transistors that have been programmed to a "1" data state will not change the voltage of their associated columns. Their column voltages remain at VPC. The different voltage levels, VPC and Vsvb, are sensed from selected columns, such as for a byte or word of information, using sense amplifiers. Even though all of the columns along a row are activated, only some of the columns are "selected" for output; that is, their data represented by their corresponding voltage levels are forwarded to the output of the memory. The selected columns are typically arranged in a periodic order throughout the population of columns (e.g., reading from every eighth column). A particular data word is selected through appropriately addressing a selected row and selected columns.

Leakage Current in ROM Devices

A read memory cycle in conventional ROM devices 100 includes an evaluation phase followed by a precharge phase. The high leakage currents in CMOS technologies are encountered during the precharge portion of the memory cycle. During precharge, the columns of the memory array are typically charged to a predetermined voltage (such as $V_{DD}$), for example, by supplying current to each column through an associated precharge transistor. For the remainder of the precharge phase, the precharge transistors will supply current to counteract any current leakage from the columns in order to maintain their voltage at the precharged level. The predominant leakage path can be subthreshold leakage through all "programmed" cell transistors connected to all of the columns. During the precharge phase, these cell transistors have their gates biased to keep the transistors in the off state. However, given the high subthreshold leakage current in state-of-the-art CMOS technologies and the large numbers of cell transistors attached to a typical column (128 to 1024), total subthreshold column leakage current can be significant. Furthermore, memory arrays typically have many columns (64 to 1024) so that the memory array subthreshold leakage current due to all the cell transistors attached to all the columns can be excessive. This leakage current is also present during standby periods where the memory is idle, i.e., not being read, but keep precharged so it is available for reading.

According to one aspect of the present invention, leakage current in ROM devices is reduced by reducing the number of columns that are precharged in any given cycle. More specifically, the present invention limits the columns to be precharged during any read cycle to a subset of columns that includes those columns that will be read during that cycle.

In contrast, conventional read operations for ROM devices precharge all columns during every read cycle. By limiting the number of columns precharged per cycle, the precharge leakage current is substantially reduced.

ROM Read Cycles

Figure 2:
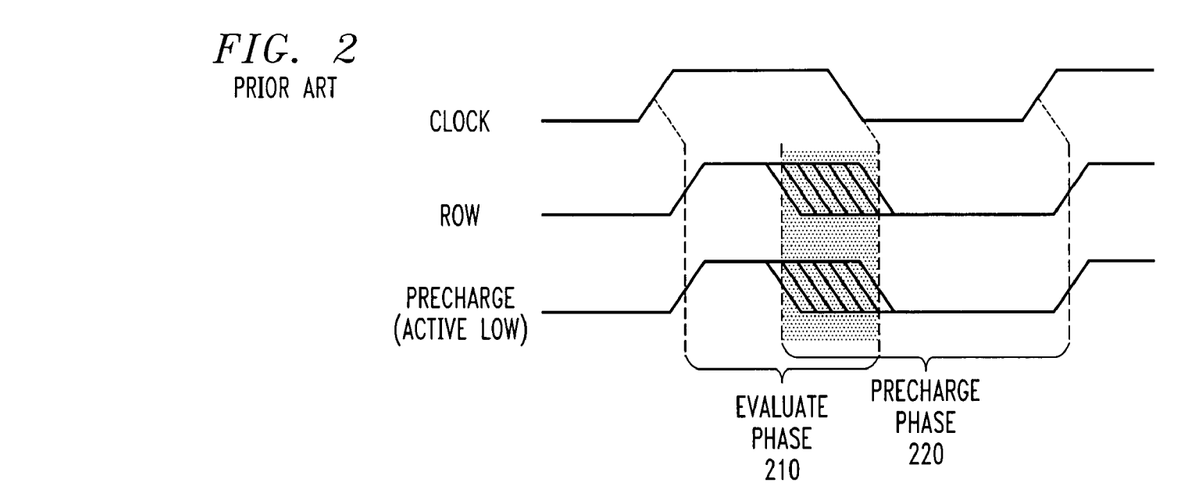
FIG. 2 illustrates the relative timing for the clock, row and precharge signals for a conventional read operation in a ROM device, such as the ROM device of FIG. 1.

As previously indicated, a ROM memory read cycle may be divided into two phases, the evaluation phase and the precharge phase. FIG. 2 illustrates the relative timing for the clock, row and precharge signals for a conventional read operation in a ROM device, such as the ROM device 100. As shown in FIG. 2, in a conventional ROM memory read cycle, the evaluation phase 210 is followed by the precharge phase 220. During a conventional read cycle, before a read cycle begins, all columns in a ROM array have been precharged, at the end of the prior cycle, to a predetermined voltage (typically $V_{DD}$). At the beginning of a read cycle, during the evaluation phase, a single row is then activated, turning on all ROM cell transistors along that row (one cell transistor per column). Those cell transistors 110 that are "programmed" will conduct current from the column to the source voltage bus (ground), changing the column voltage towards the source voltage bus potential (ground). Those cells 110 that are not programmed cannot conduct current from the column to ground because their drain is unconnected. The columns associated with these cells 110 remain substantially at the precharge voltage level.

As indicated above, subthreshold leakage current of programmed memory cell transistors 110 can drain charge from the columns to the source voltage bus (ground) during the precharge phase and after the columns have reached their precharged voltage (typically $V_{DD}$). This charge must be replenished from the precharge power supply ($V_{DD}$) in order to maintain the required column precharge voltage. With conventional ROM read cycles, the precharge phase 220 is typically one half or more of the cycle time. If the end of the evaluation phase 210 is defined by a clock edge, the precharge phase 220 is one-half cycle in duration. If the evaluation phase 210 is internally timed out, a common technique, the precharge phase 220 will be greater than one-half cycle in duration. In this case, subthreshold leakage current during precharge occurs for a longer portion of the clock cycle.

Figure 3:
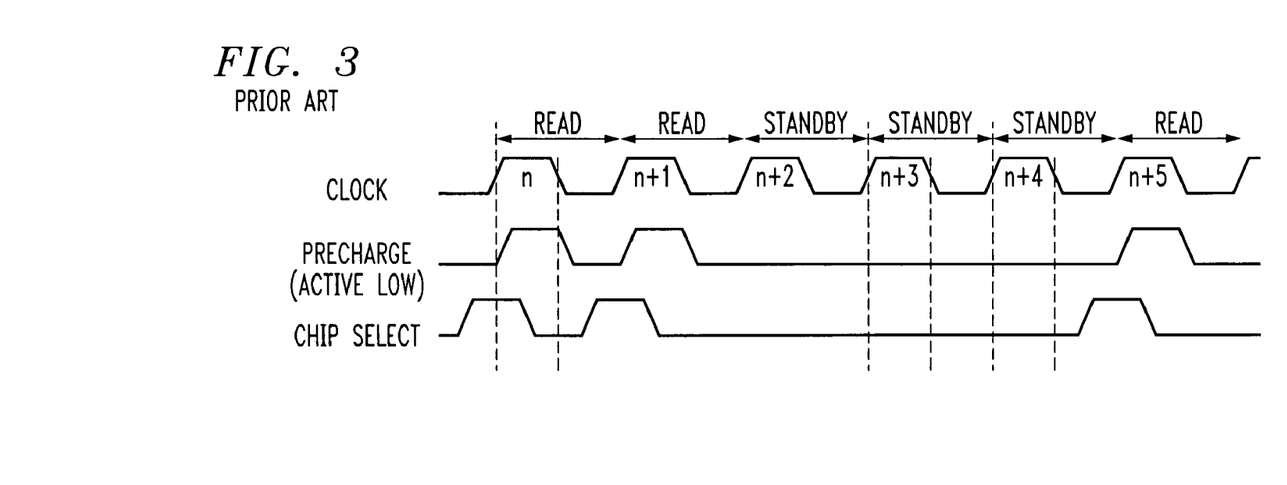
FIG. 3 illustrates the relative timing for the clock, precharge and chip select signals for sequential read and standby memory cycles in a conventional ROM memory device, such as the ROM device of FIG. 1.

FIG. 3 illustrates the relative timing for the clock, precharge and chip select signals for sequential read and standby memory cycles in a conventional ROM memory device, such as the ROM device 100. As shown in FIG. 3, when the memory 100 is inactive but maintaining its readiness to read (standby mode), the columns are actively maintained at precharge voltage. In this case, there can be high leakage current from the precharge power supply through the columns and their programmed cell transistors 110 to the source voltage bus (ground). This is due to high subthreshold leakage current of "programmed" cells.

Figure 4:
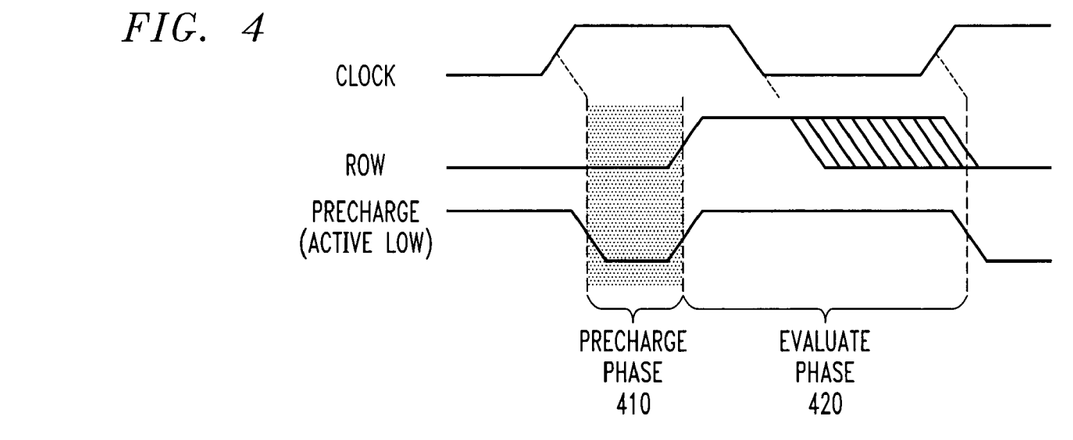
FIG. 4 illustrates suitable relative timing for the clock, row and precharge signals for a read operation in a ROM device.

FIG. 4 illustrates exemplary timing for the clock, row and precharge signals for a read operation in a ROM device that incorporates features of the invention described in U.S. patent application Ser. No. 10/764,150, entitled "Method and Apparatus for Reducing Leakage Current in a Read Only Memory Device Using Shortened Precharge Phase". As shown in FIG. 4, in an exemplary ROM memory read cycle according to the present invention, the precharge phase 410 is followed by the evaluation phase 420.

Figure 5:
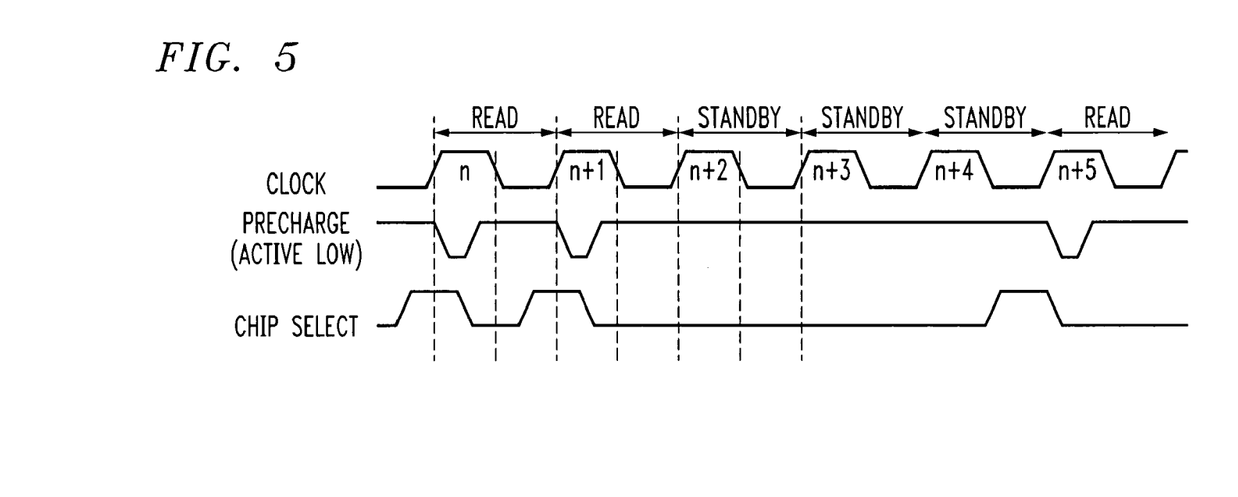
FIG. 5 illustrates suitable relative timing for the clock, precharge and chip select signals for sequential read and standby memory cycles in a ROM device.

FIG. 5 illustrates the relative timing for the clock, precharge and chip select signals for sequential read and standby memory cycles in a ROM memory device incorporating features of the invention described in U.S. patent application Ser. No. 10/764,150, entitled "Method and Apparatus for Reducing Leakage Current in a Read Only Memory Device Using Shortened Precharge Phase". As shown in FIG. 5, when the memory is inactive but maintaining its readiness to read (standby mode), the columns are not actively maintained at precharge voltage. In other words, the precharge signal is activated only during a read cycle. Thus, leakage current from the precharge power supply through the columns and their programmed cell transistors 110 to the source voltage bus (ground) is significantly reduced.

Figure 6:
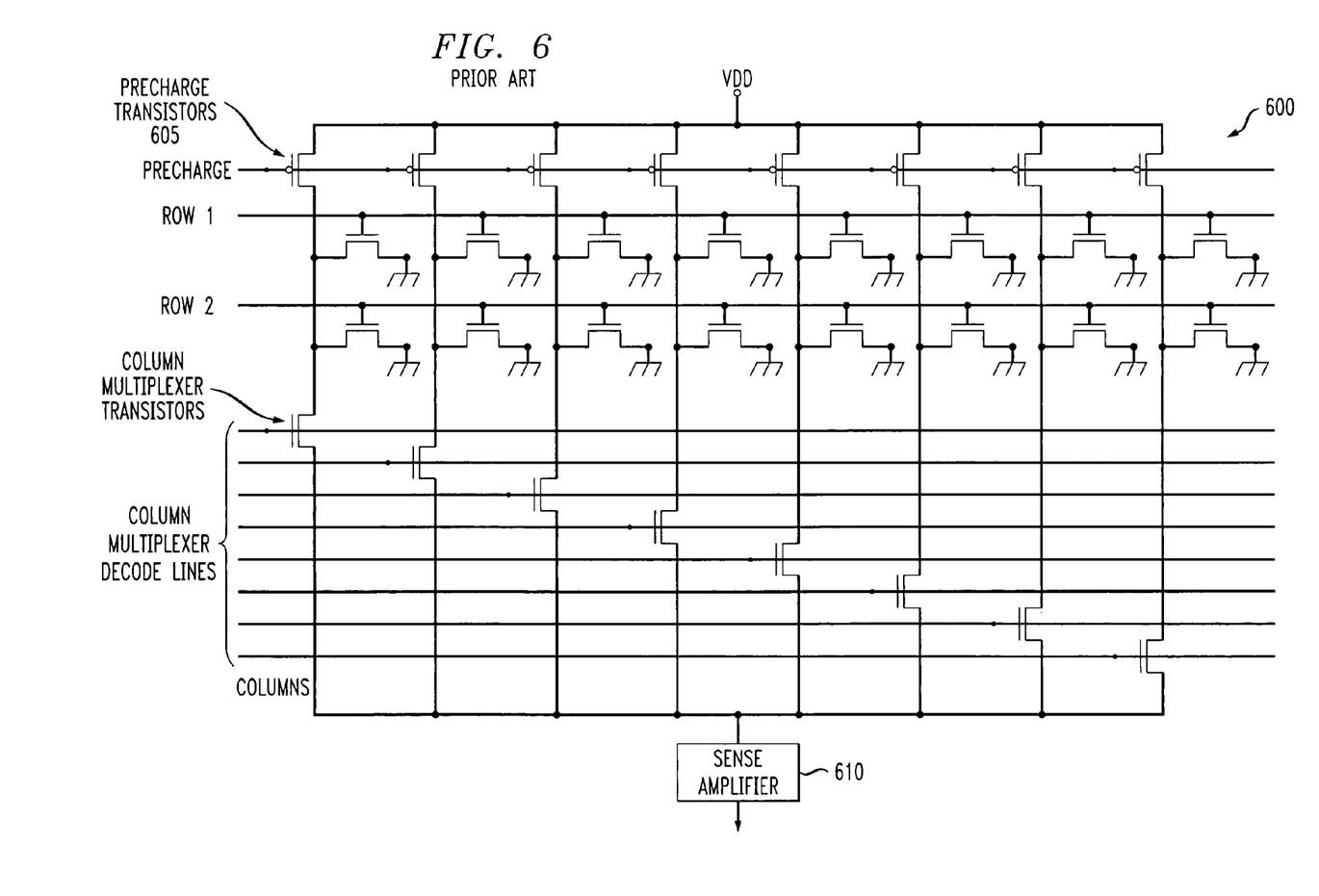
FIG. 6 illustrates a conventional column multiplexing scheme for ROM memory devices.

FIG. 6 illustrates a conventional column multiplexing scheme for ROM memory devices, where one of eight columns will be connected to an associated sense amplifier 610 for cell data-state detection. The output of the sense amplifier 610 (a single bit) is forwarded to the ROM memories output (not shown). The one of eight columns to be selected during any given read cycle, is determined by the read column address, in a known manner. The column multiplexer decode lines selects one of eight columns to be evaluated by the sense amplifier 610.

In the present example, three bits of the column address have been decoded (not shown) to select one of the eight column multiplexer decode lines. This activates only one of the eight column multiplexer transistors that connects its associated column to the sense amplifier 610. Even though only one column is read during any given read cycle, all the columns are precharged through the eight associated precharge transistors 605, resulting in significant leakage current.

Figure 7:
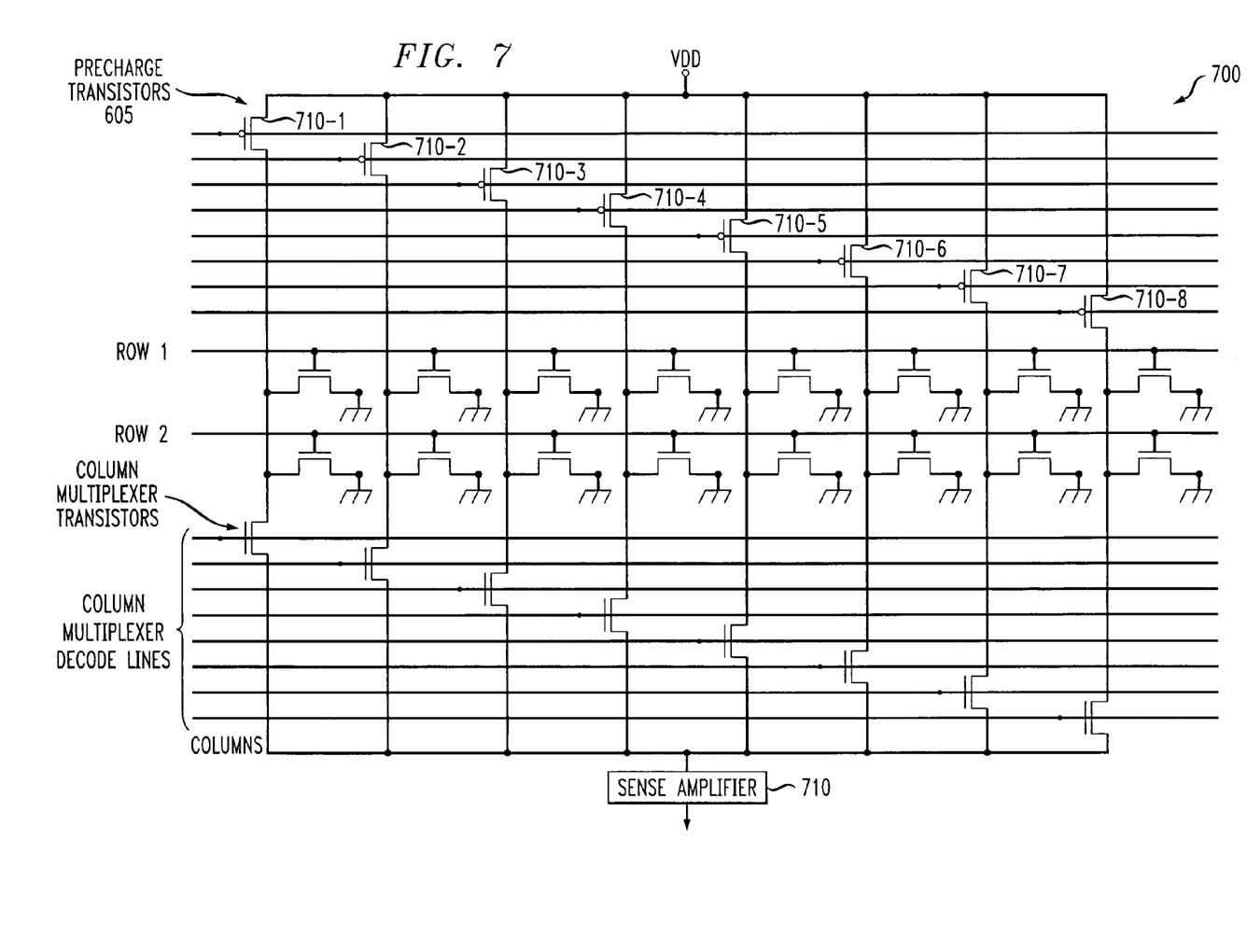
FIG. 7 illustrates a column multiplexing scheme for ROM memory devices incorporating features of the present invention.

FIG. 7 illustrates a column multiplexing scheme for ROM memory devices that incorporates features of the present invention, where one of eight columns will be connected to an associated sense amplifier 710 for cell data-state detection, in a similar manner to FIG. 6. The present invention recognizes that in a read cycle, where only a cell along the selected column will be read, only the corresponding column needs to be precharged. As shown in FIG. 7, the ROM memory array 700 (that may, for example, be part of an integrated circuit) includes a number of precharge transistors 710-1 through 710-8 that multiplex the precharge power supply ($V_{DD}$) to the columns. In this example, three bits of read column address are decoded (not shown) and used to activate only one of the eight column precharge decode lines. The associated transistor 710 will precharge the column to be read. The ROM memory array 700 reduces the precharge subthreshold leakage current to one-eighth of the precharge subthreshold leakage current associated with the conventional ROM memory array 600.

Figure 8:
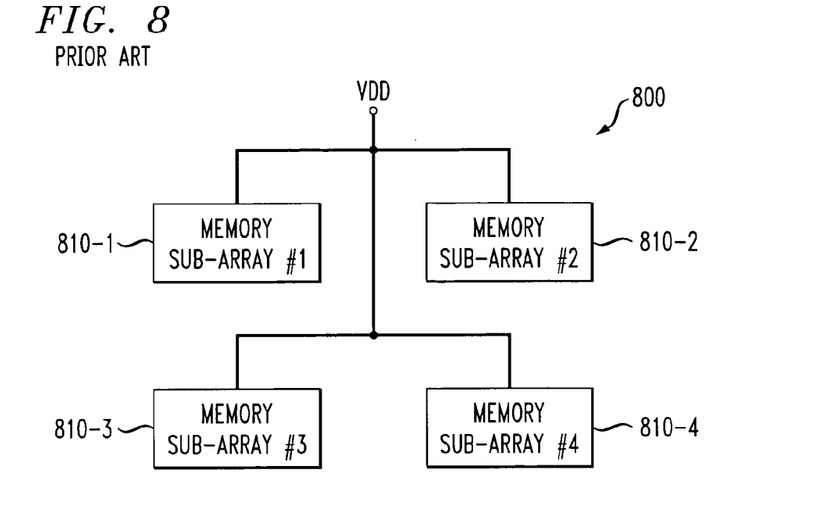
FIG. 8 illustrates a conventional ROM memory array that is divided into four sub-arrays.

FIG. 8 illustrates a conventional ROM memory array 800 that is divided into four sub-arrays 810-1 through 810-4. The sub-arrays 810 may be associated with divisions according to rows (25% of the rows are in each sub-array), columns (25% of the columns are in each sub-array) or rows and columns (25% of the rows and 25% of the columns are in each sub-array). During any given read cycle, the columns from only one sub-array 810 are read, however, all columns in all sub-arrays 810-1 through 810-4 are precharged for every read cycle.

Figure 9:
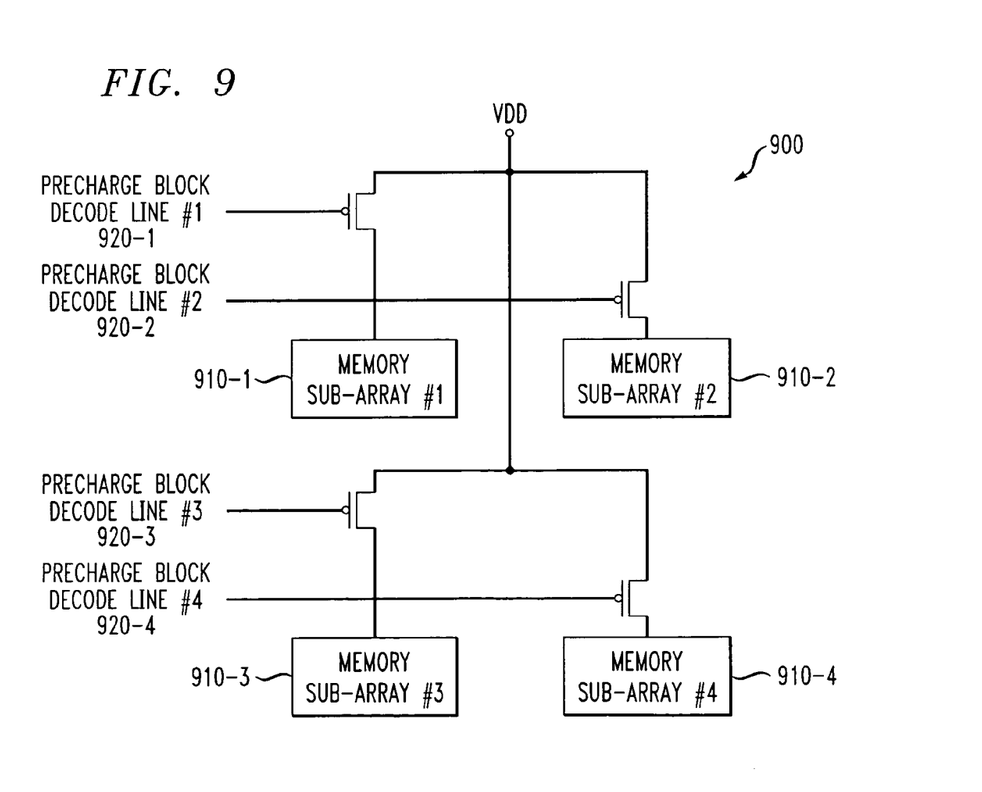
FIG. 9 illustrates a ROM memory array 900 incorporating features of the present invention that is divided into four sub-arrays.

FIG. 9 illustrates a ROM memory array 900 incorporating features of the present invention that is divided into four sub-arrays 910-1 through 910-4. The sub-arrays 910 may be associated with divisions according to rows, columns or both rows and columns in the same manner as the ROM memory array 800 of FIG. 8. As shown in FIG. 9, each sub-array 910-$i$ has an associated precharge transistor 920-$i$ that controls the flow of current for the precharge phase. During any given read cycle, only the precharge transistor 920 associated with the activated sub-array 910 will be conductive and conduct current for the precharge phase. There are four precharge block decode lines 920, only one of which will be activated during a given read cycle. In the present example, two address bits of the associated read address will determine which one of the quadrants will be precharged. Precharge subthreshold leakage current has been reduced to one-fourth that of associated prior art.

It is noted that for reduced precharge leakage current, the present invention requires precharge transistors, such as the precharge transistors 920 of FIG. 9, that control the flow of precharge current to have low subthreshold leakage. Because there are relatively few of these transistors in comparison to cell transistors, this is easily achieved by having them of sufficient channel length and/or width (or both).

It is to be understood that the embodiments and variations shown and described herein are merely illustrative of the principles of this invention and that various modifications may be implemented by those skilled in the art without departing from the scope and spirit of the invention.

We claim:

1. A method for reducing leakage current in a read only memory device comprised of an array of transistors having a plurality of columns of transistors, wherein said plurality of columns of transistors are arranged into a plurality of sub-arrays, comprising the step of:
   precharging only a portion of said columns in one of said sub-arrays during a given read cycle of said read only memory device.

2. The method of claim 1, wherein said portion of said columns is limited to a subset of columns including those columns that will be read during said given read cycle.

3. The method of claim 1, further comprising the step of decoding a read column address to precharge only said portion of said columns that will be read during said given read cycle.

4. The method of claim 1, wherein unselected columns in said plurality of columns of transistors are maintained at a ground potential.

5. The method of claim 1, further comprising the step of selectively precharging one or more of said plurality of sub-arrays having columns that will be read during said given read cycle.

6. The method of claim 1, further comprising the step of precharging only those columns that will be read during said given read cycle.

7. A read only memory device, comprising:
   an array of transistors having a plurality of columns of transistors wherein said plurality of columns of transistors are arranged into a plurality of sub-arrays; and
   a decoder for selectively precharging only a portion of said columns in one of said sub-arrays during a given read cycle.

8. The read only memory device of claim 7, wherein said portion of said columns is limited to a subset of columns including those columns that will be read during said given read cycle.

9. The read only memory device of claim 7, further comprising a decoder to decode a read column address to precharge only said portion of said columns that will be read during said given read cycle.

10. The read only memory device of claim 7, further comprising a precharge decoder to selectively precharge one or more of said plurality of sub-arrays having columns that will be read during said given read cycle.

11. The read only memory device of claim 7, wherein said read only memory device is further configured to precharge only those columns that will be read during said given read cycle.

12. A method for reading a read only memory device having a plurality of columns of transistors arranged into a plurality of sub-arrays, comprising the step of:
   precharging only a portion of said columns in one of said sub-arrays during a given read cycle of said read only memory device; and
   evaluating said read only memory device during said given read cycle.

13. The method of claim 12, wherein said portion of said columns is limited to a subset of columns including those columns that will be read during said given read cycle.

14. The method of claim 12, further comprising the step of decoding a read column address to precharge only said portion of said columns that will be read during said given read cycle.

15. The method of claim 12, further comprising the step of selectively precharging one or more of said plurality of sub-arrays having columns that will be read during said given read cycle.

16. The method of claim 12, further comprising the step of precharging only those columns that will be read during said given read cycle.

17. An integrated circuit, comprising:
   a read only memory device, comprising:
   an array of transistors having a plurality of columns of transistors, wherein said plurality of columns of transistors are arranged into a plurality of sub-arrays; and
   a decoder for selectively precharging only a portion of said columns in one of said sub-arrays during a given read cycle.

18. The integrated circuit of claim 17, wherein said portion of said columns is limited to a subset of columns including those columns that will be read during said given read cycle.

19. The integrated circuit of claim 17, further comprising a decoder to decode a read column address to precharge only said portion of said columns that will be read during said given read cycle.

20. The integrated circuit of claim 17, further comprising a precharge decoder to selectively precharge one or more of said plurality of sub-arrays having columns that will be read during said given read cycle.

21. The integrated circuit of claim 17, wherein said read only memory device is further configured to precharge only those columns that will be read during said given read cycle.

* * * * *